United States Patent [19]

Duvvury et al.

[11] Patent Number: 6,140,683
[45] Date of Patent: Oct. 31, 2000

[54] EFFICIENT NPN TURN-ON IN A HIGH VOLTAGE DENMOS TRANSISTOR FOR ESD PROTECTION

[75] Inventors: Charvaka Duvvury, Plano; David Douglas Briggs, Dallas; Fernando David Carvajal, McKinney, all of Tex.

[73] Assignee: Texas Instruments Incorporated, Dallas, Tex.

[21] Appl. No.: 09/251,015

[22] Filed: Feb. 16, 1999

Related U.S. Application Data

[62] Division of application No. 08/852,969, May 8, 1997, Pat. No. 6,071,768.

[51] Int. Cl.[7] .................................................... H01L 23/62

[52] U.S. Cl. ............................................ 257/360; 257/363

[58] Field of Search ...................................... 257/355–363

[56] References Cited

U.S. PATENT DOCUMENTS

| | | | |
|---|---|---|---|
| 5,173,755 | 12/1992 | Co et al. | 257/361 |
| 5,369,041 | 11/1994 | Duvvury | 437/6 |
| 5,453,384 | 9/1995 | Chatterjee | 437/6 |
| 5,907,462 | 5/1999 | Chaterjee | 361/56 |

*Primary Examiner*—Brian Dutton
*Attorney, Agent, or Firm*—Jacqueline J. Garner; W. James Brady, III; Frederick J. Telecky, Jr.

[57] ABSTRACT

A high voltage DENMOS transistor (10) having improved ESD protection. The transistor (10) is optimized to provide maximum substrate current in order to turn on the inherent lateral npn transistor during an ESD event so that the lateral npn can dissipate the ESD event without damage to the transistor (10). This is accomplished by optimizing the overlap (A) of the drain extended region (16) and the gate electrode (28) to control the gate coupling to achieve maximum substrate current.

6 Claims, 2 Drawing Sheets

EFFICIENT NPN TURN-ON IN A HIGH VOLTAGE DENMOS TRANSISTOR FOR ESD PROTECTION

This is a divisional application of Ser. No. 08/852,969 filed May 8, 1997, now U.S. Pat. No. 6,071,768.

FIELD OF THE INVENTION

This invention generally relates to semiconductor devices and more specifically to ESD protection in high voltage semiconductor devices.

BACKGROUND OF THE INVENTION

Current technology trends continue to focus on high performance CMOS (complementary metal-oxide-semiconductor) and a new arena of VLSI (very-large-scale integration) called Smart Power chips is being developed. Smart Power chips are built with both low and high voltage CMOS. Power transistors (e.g. the high voltage CMOS) on these Smart Power chips typically allow operating voltages up to 40 volts. The thrust of current research focuses on improving the high voltage transistor performance.

Smart Power chips are widely used in the automotive industry. The automotive environment is harsh and requires relatively high levels of protection against ESD and other types of transients. However, power transistors are generally weak for ESD due to their inherent device structure. Good ESD performance actually requires low power dissipation capability under high currents. This is inherent in optimized thin oxide nMOS transistor structures, but not in high voltage power transistors. The thin-oxide nMOS transistor inherently includes a lateral npn formed of the drain (collector), substrate (base) and source region (emitter). This lateral npn provides excellent ESD protection by efficiently dissipating the ESD event However, for the typical high voltage transistor, such as the DENMOS (drain extended nMOS), lateral bipolar action is difficult to initiate or turn-on.

A prior-art DENMOS power transistor is shown in FIG. 1. The DENMOS is built in a p-tank 112 located in a p-type epitaxial substrate 110. The drain 116 is formed in a n-well 114 The source 118 is formed directly in the stank 112. The gate 120 is located partially over the stank and partially over a field oxide region 122 that is located between the drain 116 and the source 118. A 500 Å gate oxide 124 is located between the gate 120 and the p-tank 112. Typical channel lengths (between the source 118 edge and the n-well 114 edge) are on the order of 5 $\mu$m. This is too long for the inherent bipolar device to turn-on during an ESD event Instead, during ESD, the n-tank at the drain gets fully depleted and the device operates as a vertical diode dissipating the current through the substrate. However, this creates a high field at the thin oxide below the gate before the ESD event is dissipated that can often damage the device. Therefore, there is a need for a high voltage transistor having improved ESD protection capability.

SUMMARY OF THE INVENTION

A high voltage transistor having improved ESD protection capability is disclosed herein. The transistor is optimized to provide maximum substrate current in order to turn on the inherent lateral npn transistor during an ESD event so that the lateral npn can dissipate the ESD event without damage to the transistor. This is accomplished by optimizing the overlap of the drain extended region and the gate to control the gate coupling to achieve maximum substrate current under the ESD event.

An advantage of the invention is providing a high voltage transistor having improved ESD protection capability.

A further advantage of the invention is providing a layout for a high voltage transistor that maximizes substrate current under ESD conditions to efficiently turn on an inherent lateral npn.

These and other advantages will be apparent to those of ordinary skill in the art having reference to the specification in conjunction with the drawings.

BRIEF DESCRIPTION OF THE DRAWINGS

In the drawings:

FIG. 3 is a schematic diagram of an equivalent circuit for the DENMOS of FIG. 2a;

Corresponding numerals and symbols in the different figures refer to corresponding parts unless otherwise indicated.

DETAILED DESCRIPTION OF PREFERRED EMBODIMENTS

The invention is described in conjunction with a high voltage DENMOS transistor. The high voltage transistor according to the invention may be used for ESD protection of inputs and power pins on high voltage devices (e.g., those having operating voltages in excess of 30 V), such as Smart Power chips used in the automotive industry. The invention is also applicable to other MOS transistors that traditionally have difficulty in turning on their inherent npn (i.e., MOS transistors having a long channel length).

Figure 1:
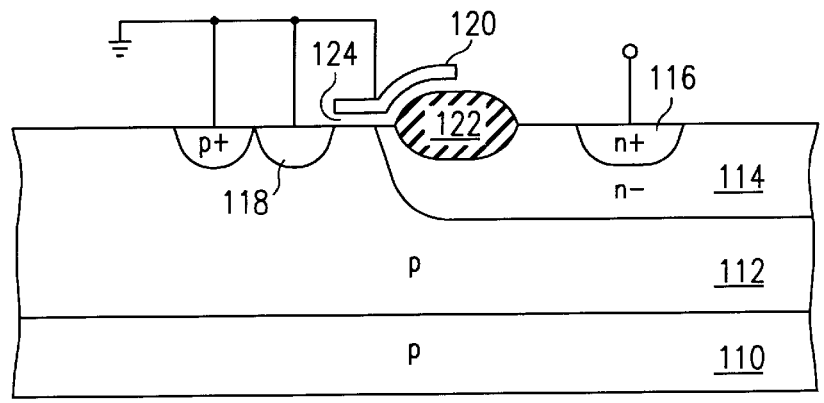
FIG. 1 is a cross-sectional view of a prior art DENMOS transistor.
Figure 2A:
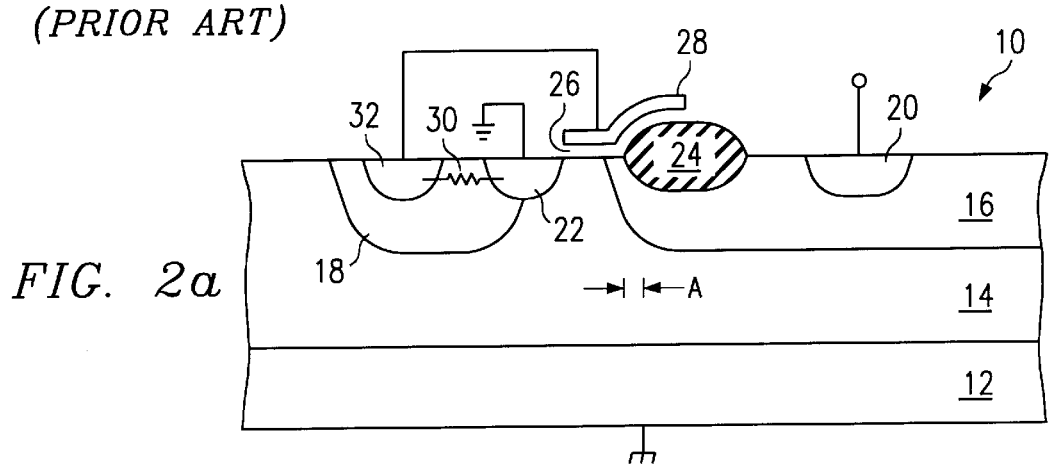
FIG. 2a is a cross-sectional view of a DENMOS according to the invention.
Figure 3:
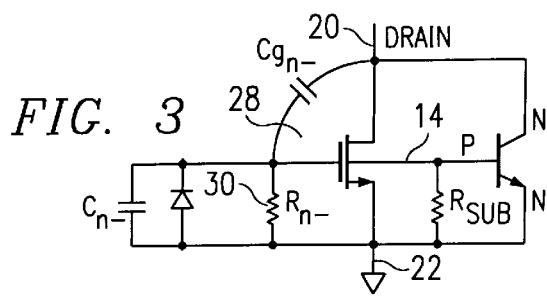

A high voltage DENMOS transistor 10 according to an embodiment of the invention is shown in FIG. 2a and an equivalent circuit for DENMOS transistor 10 is shown in FIG. 3. DENMOS 10 is located in a high voltage p-tank region 14 in a p-type substrate 12. DENMOS 10 includes two n-type well regions 16 and 18 located in stank region 14. The first n-type well region 16 is known as a drain extended region. Drain region 20 is located within drain extended region 16. Source region 22 is located partly within the second n-type well region 18 and partly directly within stank region 14. This maintains a low resistance path to the source region from the drain region 20. Drain region 20 and source region 22 are of the same conductivity type as well regions 16 and 18 and have a higher dopant concentration than well regions 16 and 18. A field oxide region 24 is also formed within drain extended region 16. Drain extended region 16 extends past the edge of field oxide region 24 under the gate oxide 26 and gate electrode 28. The spacing, A, that the extended drain region 16 overlaps the gate electrode 28 at the thin gate oxide 26 determines the amount of gate coupling between the gate and drain and determines the breakdown of the transistor 10. The source region is connected to ground and the gate electrode 28 is connected through resistor 30 to ground. In the preferred embodiment, the resistor 30 is located within the second n-well 18 between a diffused region 32 that is connected to the gate electrode 28 and the diffused source region 22.

DENMOS 10 includes an inherent npn bipolar transistor. The drain region 20 serves as the collector, the substrate 12/p-tank14 serves as the base, and the source region 22 serves as the emitter. In prior art DENMOS structures the inherent npn is difficult to turn on to effectively dissipate an ESD event. However, DENMOS 10 is optimized to efficiently turn on the inherent npn during an ESD event. First, the source region 22 is placed partly in Stank 14. This reduces the resistance between the collector (drain region 20) and the emitter (source region 22). Second, the gate coupling effect between drain and gate is used to maximize the substrate current under an ESD event Since the gate coupling effect is determined by the distance A (i.e., the overlap of the drain extended region and the gate electrode at the thin oxide region), the overlap is optimized for maximum substrate current. Maximizing the substrate current increases the substrate potential which, in turn, allows for efficient turn-on of the inherent lateral npn during the ESD event Because the substrate serves as the base of the inherent lateral npn, increasing the potential of the substrate increases the potential of the base which allows the lateral npn to turn on more easily. The ESD event may thus be dissipated through the lateral npn without damaging the transistor. This is due to the fact that the lateral npn dissipates the ESD event through the bulk region of DENMOS 10 instead of at the surface or through the drain/substrate junction. Both dissipating the ESD event at the surface and through the substrate (neither of which occurs in the present invention) creates a high voltage field at the surface where the thin oxide separates the gate electrode from the channel region. This causes damage to the transistor and reduces the ESD protection level in prior art high voltage transistors. Because DENMOS 10 according to the invention dissipates the ESD event through the inherent npn transistor, the ESD protection is improved.

Figure 2B:
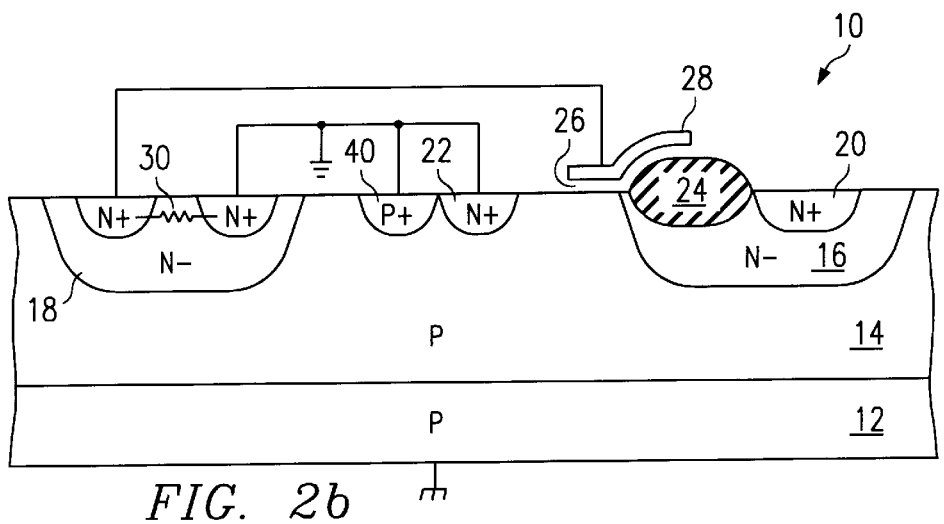
FIG. 2b is a cross-sectional view of a DENMOS according to an alternative embodiment of the invention.

It should be noted that the p+ diffused region that is traditionally located on the source side of prior art DENMOS structures to contact the substrate is preferably omitted. This has two advantages. First, a more compact layout can be achieved by integrating the resistor 30 in well region 18. Resistor 30 can be more compactly located nearer to source region 22 than could be possible if a p+ contact region is used. Second, removing the p+ contact allows more substrate current to go to the bottom substrate connection This increases the potential of the substrate during an ESD event and causes the inherent npn to turn on more efficiently. If the p+ contact were used, some of the current could be dissipated through the p+ contact making it harder to raise the potential of the substrate and turn on the inherent npn. Although it is preferred that the p+ contact be omitted, omitting the p+ contact is not necessary to practice the invention. FIG. 2b illustrates a cross-section of an embodiment of the invention which illustrates a p+ contact 40 at the source. In this case, resistor 30 is located remotely from the source.

Figure 4:
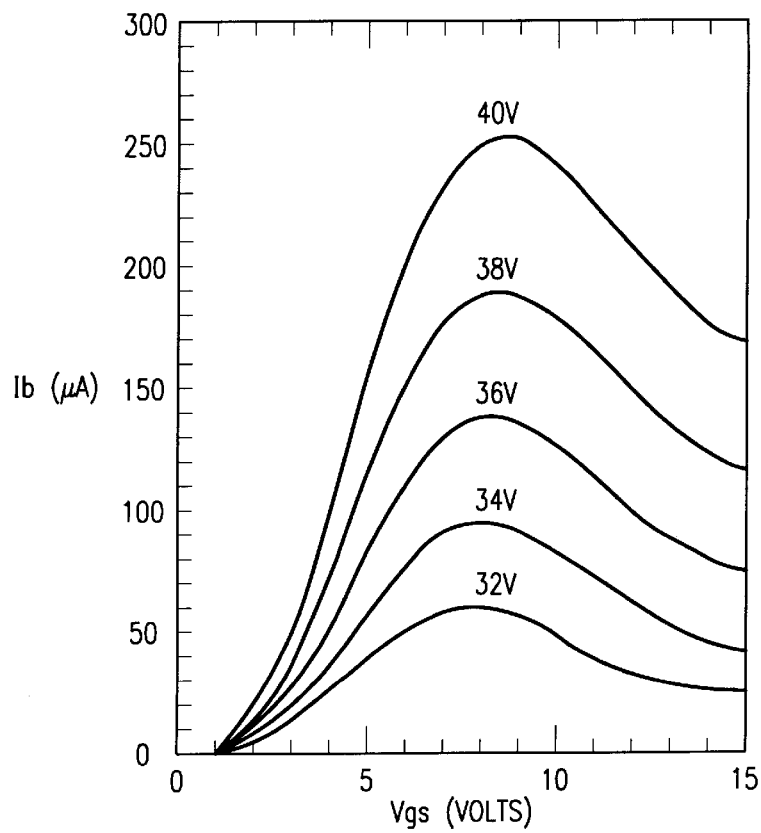
FIG. 4 is a graph of substrate current versus gate bias at various drain voltages.

A method for optimizing the overlap distance A will now be discussed. For a given practical channel length (i.e., the distance between the drain extended region 16 and the source region 22), the substrate current is measured as a function of gate bias. This may be accomplished by testing an actual device. FIG. 4 shows a graph of substrate current versus gate bias for an exemplary device at various drain voltages. The gate bias resulting in the maximum substrate current at the expected drain voltage is chosen. The gate bias for maximum substrate current for transistor having a device length on the order of 5 $\mu$m and a drain operating voltage in the range of 30–40 volts may be in the range of 8–10 volts. It should be noted that although a range is given, the appropriate gate bias should be chosen based on a specific transistor design and that not every voltage in the range of 8–10 volts will correspond to maximum substrate current.

Next, SPICE simulations are done to ramp the drain voltage (typically 0–40 volts) at various overlap spacings A This is done to optimize gate coupling to achieve the gate bias that corresponds to maximum substrate current as previously determined. The overlap spacing A may typically be in the range of 1–2 $\mu$m. However, the optimum overlap spacing A is specific to a given transistor specifications and depending on theses specifications only a subset of the range given above is appropriate for a given transistor.

The value of resistor 30 is designed so that the time constant on the gate discharging back to 0 volts is long enough to allow for the lateral npn to turn on but not long enough to interfere with circuit operation. For example, this may be in the range of 10 to 100 nsec. Typical values of resistor 30 are expected to be in the range of 10–20 k$\Omega$.

Finally, the substrate potential under the ESD event is calculated using the maximum substrate current and the doping level of the stank region 14. Ideally, this may be 0.5V or greater to ensure turn-on of the lateral npn. If necessary, the stank region 14 doping level may be adjusted to increase resistance and tune the substrate potential. A dopant concentration on the order of 5E15 to 1E16/$cm^3$ is preferred for p-tank region 14. In some cases, adjusting the doping level of the p-tank region 14 may be sufficient to cause efficient turn-on of the inherent lateral npn.

During an ESD event, the voltage at the drain 20 increases. Because of the gate coupling between the drain and gate (as determined by overlap A), substrate current between the drain and substrate is generated. This, in turn causes the substrate potential to rise. Because the gate coupling is chosen for maximum substrate current, substrate potential increases sufficiently to turn on the lateral npn When the substrate potential reaches 0.3 to 0.5V, the pn junction between the substrate and the source region 22 begins to turn on. This is the base-emitter junction of the npn and it is thus forward biased so that the npn begins to dissipate the ESD event. In the meantime, the gate coupling voltage dissipates through resistor 30 to ground. Resistor 30 determines the time constant for the discharging of the gate coupling voltage and ensures that discharging does not occur before the lateral npn turns on. The time constant for discharging the gate electrode is not critical as long as it is enough time to turn on the lateral npn and not long enough time to interfere with circuit operation. The time constant may be in the range of 10 to 100 nsec.

Figure 5:
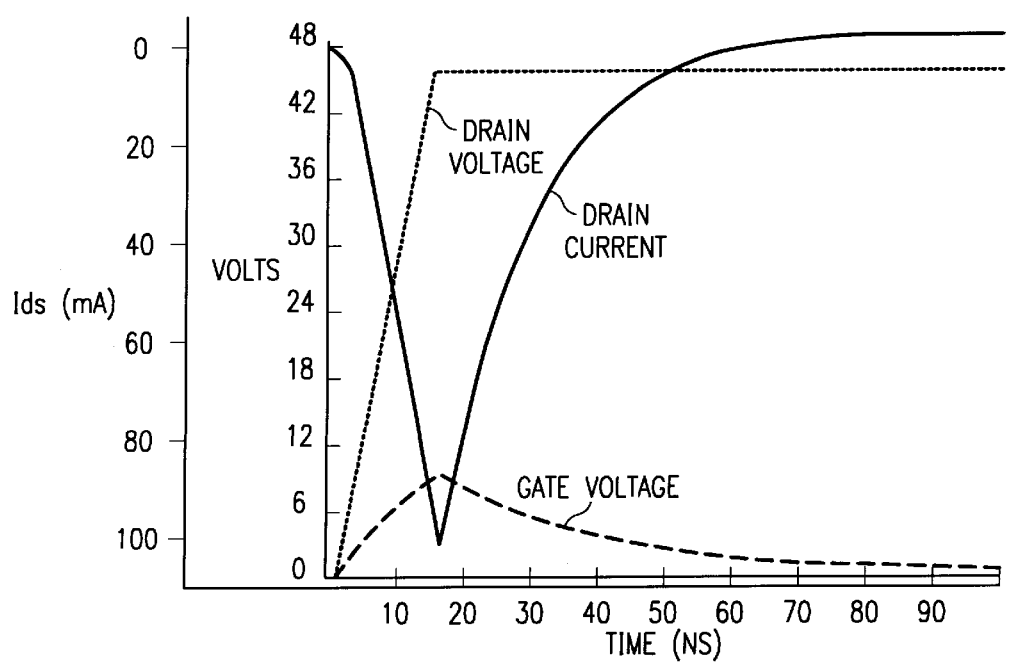
FIG. 5 is a graph of simulation results for an ESD transient of 45 V.

Exemplary values for a DENMOS according to the invention will now be discussed. The channel length is on the order 5 $\mu$m. The width of the drain extension region is on the order of 5 $\mu$m. Resistor 30 is on the order of 15 k$\Omega$. The overlap spacing A is on the order of 2 $\mu$m. Average boron concentration underneath the source is 5E15/$cm^3$, corresponding to a p of 30 Kohm-$\mu$m. Simulation results for a ESD transient of 45 V at the drain and a rise time of 15 ns for a 600/5 $\mu$m device are shown in FIG. 5. The gate couples to about 9 volts which corresponds to the maximum substrate current before discharging with a time constant greater than 50 ns. The peak drain current is about 100 mA. This increases the substrate potential to about 0.6 V. Combined with the high npn β with the lightly doped p-tank, this allows an effective turn-on of the lateral npn to result in excellent ESD protection for power IC I/O applications.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A DENMOS transistor for ESD protection located in a substrate, comprising:

a p-type tank region located in said substrate;

a drain extended region located in said p-type tank region;

a drain region located within said drain extended region;

a n-well region located in said p-type tank region;

a source region located partly within said n-well region and partly within said p-type tank region;

a field oxide region located over a portion of said drain extend region;

a gate oxide located adjacent said field oxide region and extending from said field oxide region to said source region; and a gate electrode extending over said gate oxide and part of said field oxide region, wherein said drain extended region overlaps a portion of said gate electrode extending over said gate oxide to a distance corresponding to maximum substrate current under ESD conditions.

2. The DENMOS of claim 1, wherein said p-type tank region has a resistivity on the order of 30 Kohm-$\mu$m.

3. The DENMOS of claim 1, further comprising a resistor connected between said gate electrode and said source region.

4. The DENMOS of claim 3, wherein said resistor is located within said n-well region.

5. The DENMOS of claim 3, wherein said resistor is in the range of 10–20 Kohms.

6. The DENMOS of claim 3, wherein said overlap of said drain extended region and said gate electrode is on the order of 2 $\mu$m.

* * * * *